(12) United States Patent
Konomi

(10) Patent No.: US 10,026,698 B2
(45) Date of Patent: Jul. 17, 2018

(54) REDUCING WAFER WARPAGE DURING WAFER PROCESSING

(71) Applicant: TOSHIBA MEMORY CORPORATION, Minato-ku (JP)

(72) Inventor: Kenji Konomi, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/722,524

(22) Filed: Oct. 2, 2017

(65) Prior Publication Data

US 2018/0025995 A1 Jan. 25, 2018

Related U.S. Application Data

(62) Division of application No. 14/833,420, filed on Aug. 24, 2015, now Pat. No. 9,812,403.

(60) Provisional application No. 62/132,327, filed on Mar. 12, 2015.

(51) Int. Cl.
*H01L 21/77* (2017.01)
*H01L 23/00* (2006.01)
*H01L 21/784* (2006.01)
*H01L 23/58* (2006.01)

(52) U.S. Cl.
CPC .......... *H01L 23/562* (2013.01); *H01L 21/784* (2013.01); *H01L 23/585* (2013.01); *H01L 2924/14* (2013.01); *H01L 2924/3511* (2013.01); *H01L 2924/37001* (2013.01)

(58) Field of Classification Search
CPC ... H01L 23/562; H01L 21/784; H01L 23/585; H01L 2924/3511; H01L 2924/14; H01L 2924/37001
See application file for complete search history.

(56) References Cited

U.S. PATENT DOCUMENTS

2008/0083959 A1  4/2008  Wu

FOREIGN PATENT DOCUMENTS

| JP | 07-86511    | 3/1995 |
| JP | 2005-012060 | 1/2005 |
| JP | 2005-228892 | 8/2005 |

*Primary Examiner* — Joseph C Nicely
*Assistant Examiner* — Pavel Ivanov
(74) *Attorney, Agent, or Firm* — Oblon, McClelland, Maier & Neustadt, L.L.P.

(57) ABSTRACT

According to one embodiment, there is provided a manufacturing method of a semiconductor device. The method includes forming a first guard ring around a first chip region on a semiconductor wafer. The method includes forming a second guard ring around a second chip region on the semiconductor wafer. The method includes mechanically connecting the first guard ring with the second guard ring through a joist structure.

7 Claims, 14 Drawing Sheets

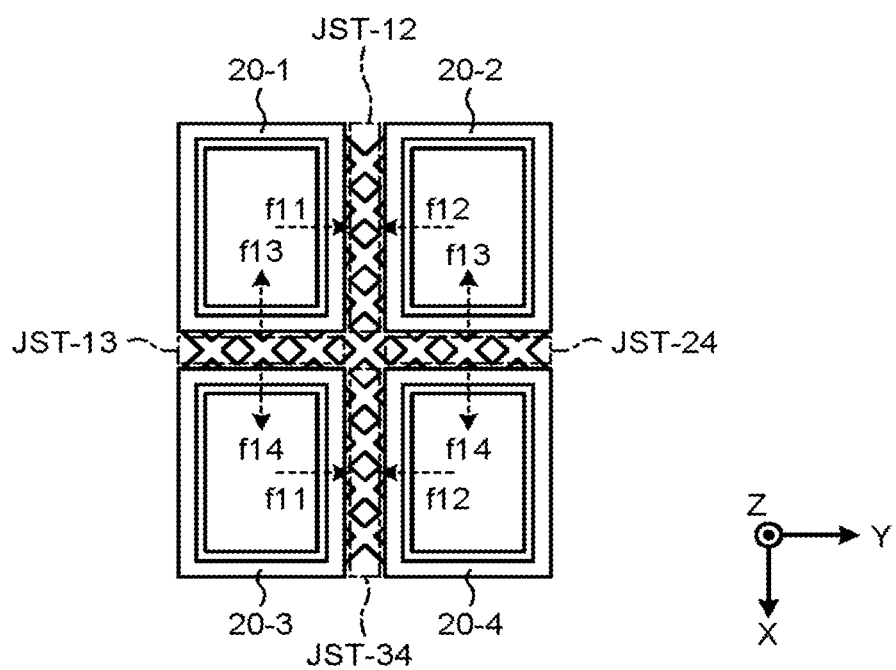

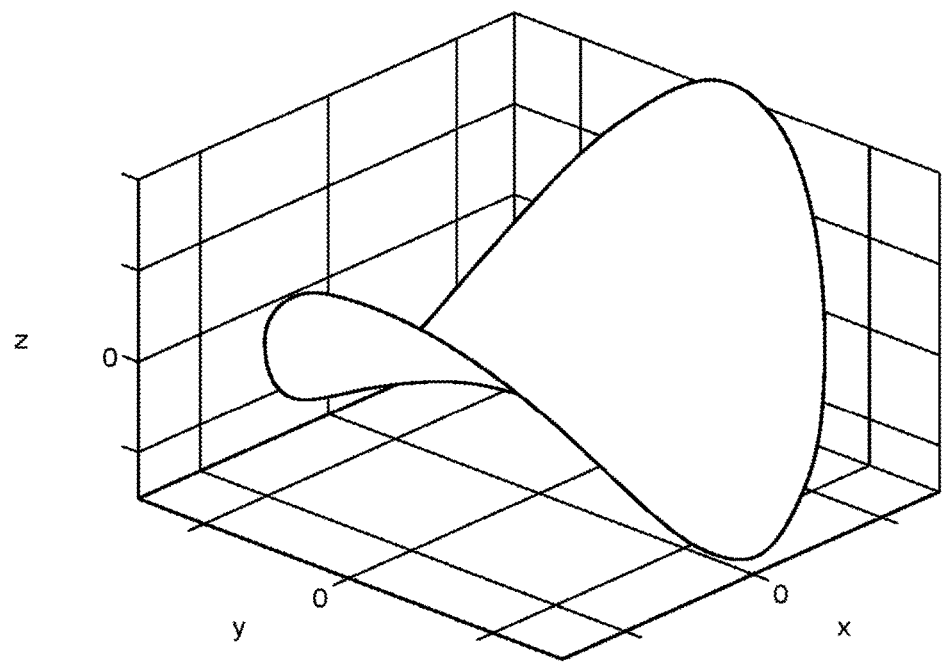
FIG.5
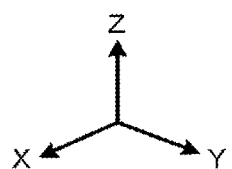

FIG.7
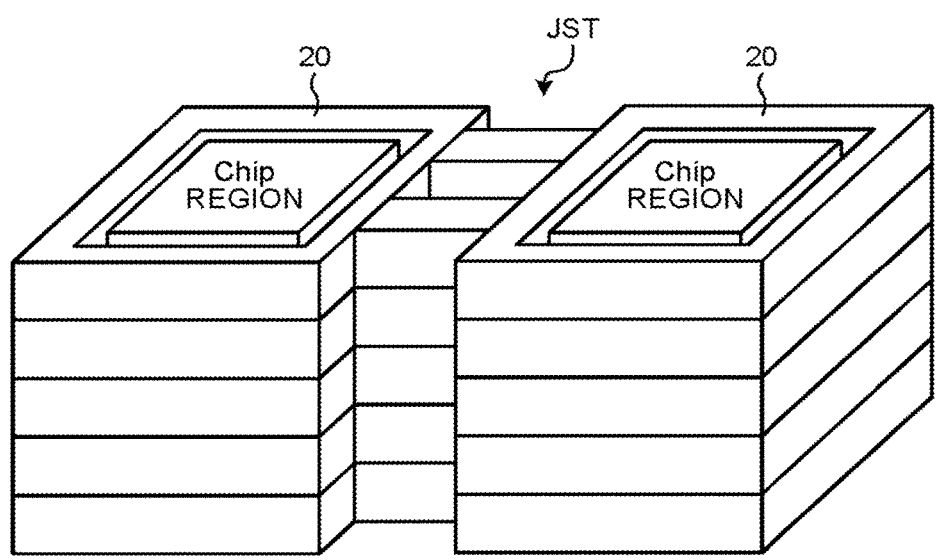
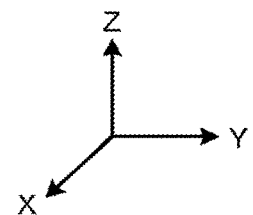

REDUCING WAFER WARPAGE DURING WAFER PROCESSING

CROSS-REFERENCE TO RELATED APPLICATIONS

This application is a Divisional of U.S. application Ser. No. 14/833,420 filed Aug. 24, 2015, and is based upon and claims the benefit of priority from U.S. Provisional Application No. 62/132,327, filed on Mar. 12, 2015 the entire contents of each of which are incorporated herein by reference.

FIELD

Embodiments described herein relate generally to a manufacturing method of a semiconductor device, a semiconductor wafer, and a semiconductor device.

BACKGROUND

In a process of manufacturing a semiconductor device, there are cases in which warpage occurs in a semiconductor wafer. At this time, it is desirable to reduce warpage of a semiconductor wafer.

BRIEF DESCRIPTION OF THE DRAWINGS

FIG. 4D is an enlarged plane view illustrating a joist structure according to an embodiment;

FIG. 5 is a perspective view illustrating a warping state of a semiconductor wafer according to an embodiment;

FIG. 7 is a perspective view illustrating a layer structure of a guard ring and a joist structure according to an embodiment;

DETAILED DESCRIPTION

In general, according to one embodiment, there is provided a manufacturing method of a semiconductor device. The method includes forming a first guard ring around a first chip region on a semiconductor wafer. The method includes forming a second guard ring around a second chip region on the semiconductor wafer. The method includes mechanically connecting the first guard ring with the second guard ring through a joist structure.

Exemplary embodiments of a manufacturing method of a semiconductor device, a semiconductor wafer, and a semiconductor device will be explained below in detail with reference to the accompanying drawings. The present invention is not limited to the following embodiments.

Embodiments

A manufacturing method of a semiconductor device according to an embodiment will be described. In a manufacturing method of a semiconductor device, there are cases in which a semiconductor wafer WF is deformed.

In other words, in a manufacturing method of a semiconductor device, a certain film is formed on a semiconductor wafer WF, the certain film is coated with a resist solution, an exposure process of transferring a mask pattern onto a resist film is performed, and a latent image pattern is formed on the resist film. Thereafter, fine pattern processing is performed on the certain film by developing the latent image pattern and performing etching using a developed pattern as a mask. A semiconductor integrated circuit is formed on the semiconductor wafer WF by repeatedly performing the film forming process, the lithography process (the coating process, the exposure process, the developing process, and the like), and the processing process. At this time, as the film is formed on the semiconductor wafer WF, and the fine patterning processing is performed on the certain film, a stress is applied to the semiconductor wafer WF.

For example, a difficulty level of downsizing a semiconductor integrated circuit has increased, and a downsizing pace has slowed down. For a semiconductor memory, in order to increase storage capacity without downsizing, a so-called three-dimensional (3D) memory in which memory elements have a stacked structure, and a storage capacity is increased by increasing the number of stacked memory elements has been developed. In a process of manufacturing a 3D memory, a stress is applied to a semiconductor wafer WF while a stacked structure is being formed.

Figure 3A:
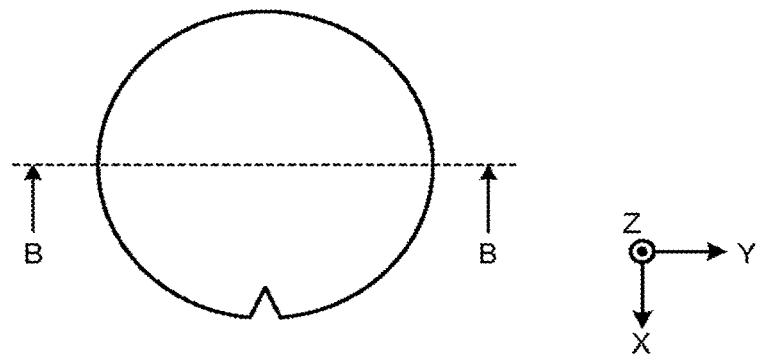
FIG. 3A is a plane view illustrating a semiconductor wafer according to an embodiment.
Figure 3B:
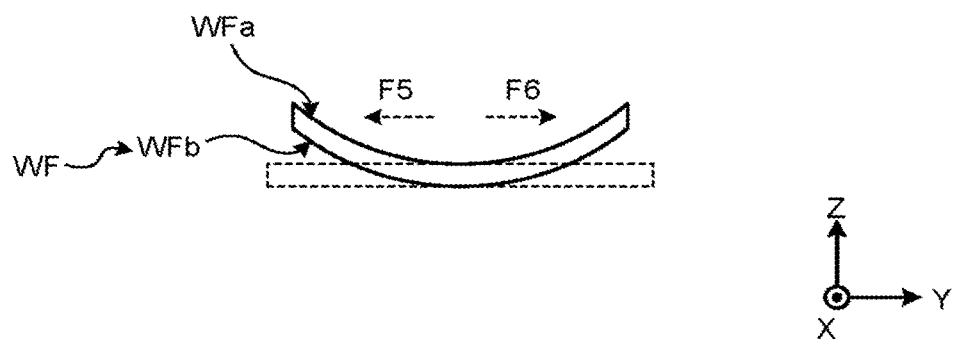
FIG. 3B is a cross-sectional view illustrating a warping state of a semiconductor wafer according to an embodiment.
Figure 4A:
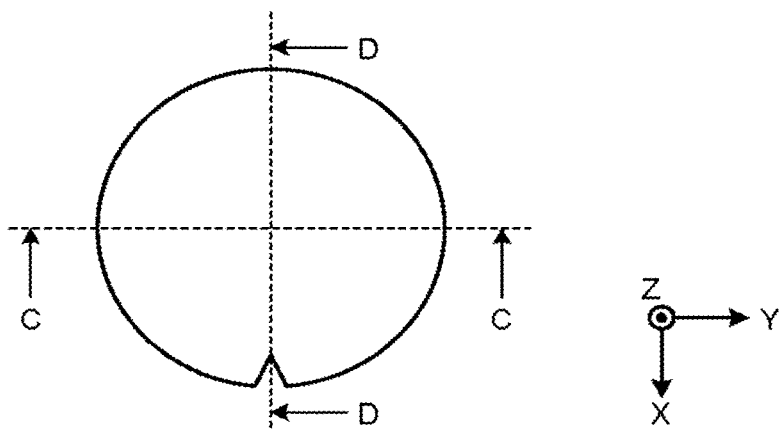
FIG. 4A is a plane view illustrating a semiconductor wafer according to an embodiment.
Figure 4B:
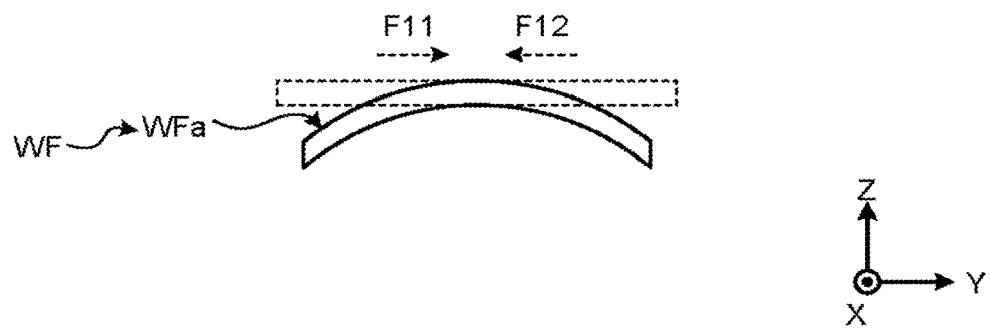
FIGS. 4B and 4C are cross-sectional views illustrating a warping state of a semiconductor wafer according to an embodiment.
Figure 4C:
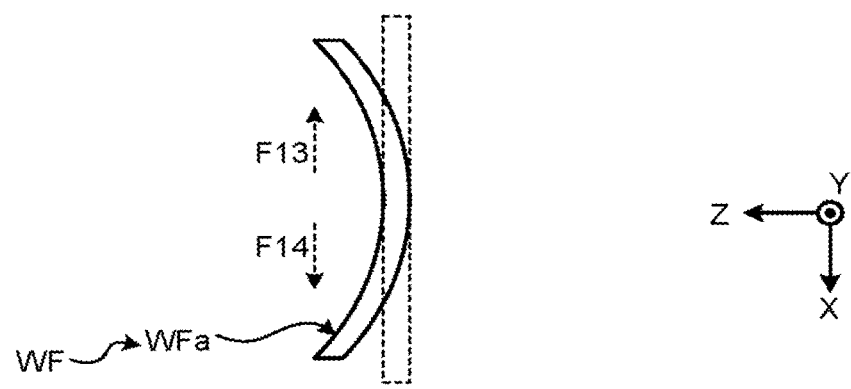

Thus, for example, there are cases in which the semiconductor wafer WF is deformed such that the surface side is convex (see FIGS. 2A and 2B) or the back side is convex (see FIGS. 3A and 3B), or the semiconductor wafer WF is deformed in a saddle shape (see FIGS. 4A to 4C).

If the semiconductor wafer WF is deformed such that the back side is convex, although the semiconductor wafer WF is placed on a stage in which a plurality of vacuum suction holes are formed, it is difficult to hold the semiconductor wafer WF flatly through the vacuum suction since a distance from the vacuum suction hole to the semiconductor wafer WF is too large. Thus, if the semiconductor wafer WF deformed such that the back side is convex is processed, the semiconductor wafer WF is likely to slip or drop from a conveyance robot when the semiconductor wafer WF is conveyed. In other words, a semiconductor wafer WF conveyance trouble is likely to occur in a manufacturing apparatus.

If the semiconductor wafer WF is deformed, when the film forming process is performed, since it is difficult to hold the semiconductor wafer WF flatly, for example, the airflow of processing gas changes, and thus in-plane uniformity of a film forming amount may deteriorate.

If the semiconductor wafer WF is deformed, when the coating process is performed, since it is difficult to hold the semiconductor wafer WF flatly, there are cases in which in-plane uniformity of a resist solution supply amount in the surface of the semiconductor wafer WF deteriorates, and thus in-plane uniformity of a film thickness of a resist film deteriorates.

If the semiconductor wafer WF is deformed, when the exposure process is performed, since it is difficult to hold the semiconductor wafer WF flatly, a mask pattern is unlikely to be appropriately transferred onto the semiconductor wafer WF, and thus a latent image pattern is unlikely to be appropriately formed. For example, if a height difference in a shot region of the surface of the semiconductor wafer WF is increased to exceed a focal depth of an exposure apparatus, a mask pattern image is unlikely to be formed on the surface of the semiconductor wafer WF. Or, although a mask pattern image is formed on the surface of the semiconductor wafer WF, an overlay accuracy between layers is likely to degrade.

If the semiconductor wafer WF is deformed, when the thermal treatment process (for example, a baking process after exposure or the like) is performed, since it is difficult to hold the semiconductor wafer WF flatly, in-plane uniformity of thermal history of the semiconductor wafer WF is likely to deteriorate. For example, when an exposed resist film is a chemically amplified resist, a reaction between an acid generated by a photo-acid-generating agent and base resin is not sufficiently accelerated, and a latent image pattern in a resist is likely to become an imperfect state.

If the semiconductor wafer WF is deformed, when the developing process is performed, since it is difficult to hold the semiconductor wafer WF flatly, in-plane uniformity of an alkaline developer supply amount in the surface of the semiconductor wafer WF is likely to deteriorate, and in-plane uniformity of a development amount is likely to deteriorate.

For example, a countermeasure of improving a mechanism of holding the semiconductor wafer WF so that even a semiconductor wafer WF having a large warpage can be stably conveyed at a manufacturing apparatus side and a countermeasure of adding a process of measuring a warpage amount, feeding forward a measurement result, and performing overlay correction are considered. However, there is a limit to a warpage amount that can be dealt while satisfying a required accuracy, and there is an urgent need for a countermeasure of reducing the occurrence of warpage at the semiconductor wafer WF side.

Figure 1A:
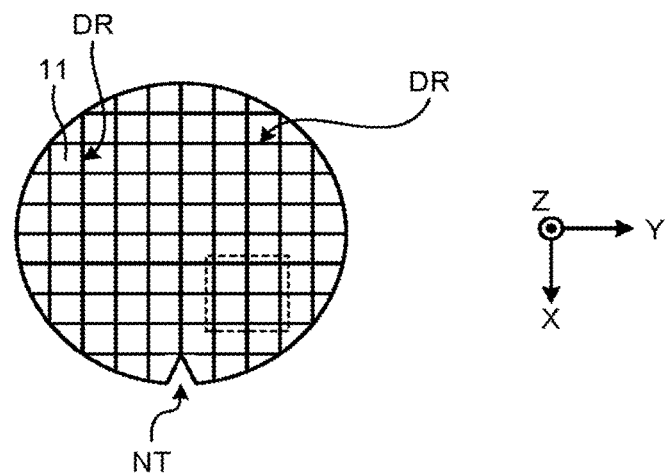
FIG. 1A is a plane view illustrating a semiconductor wafer according to an embodiment.
Figure 1B:
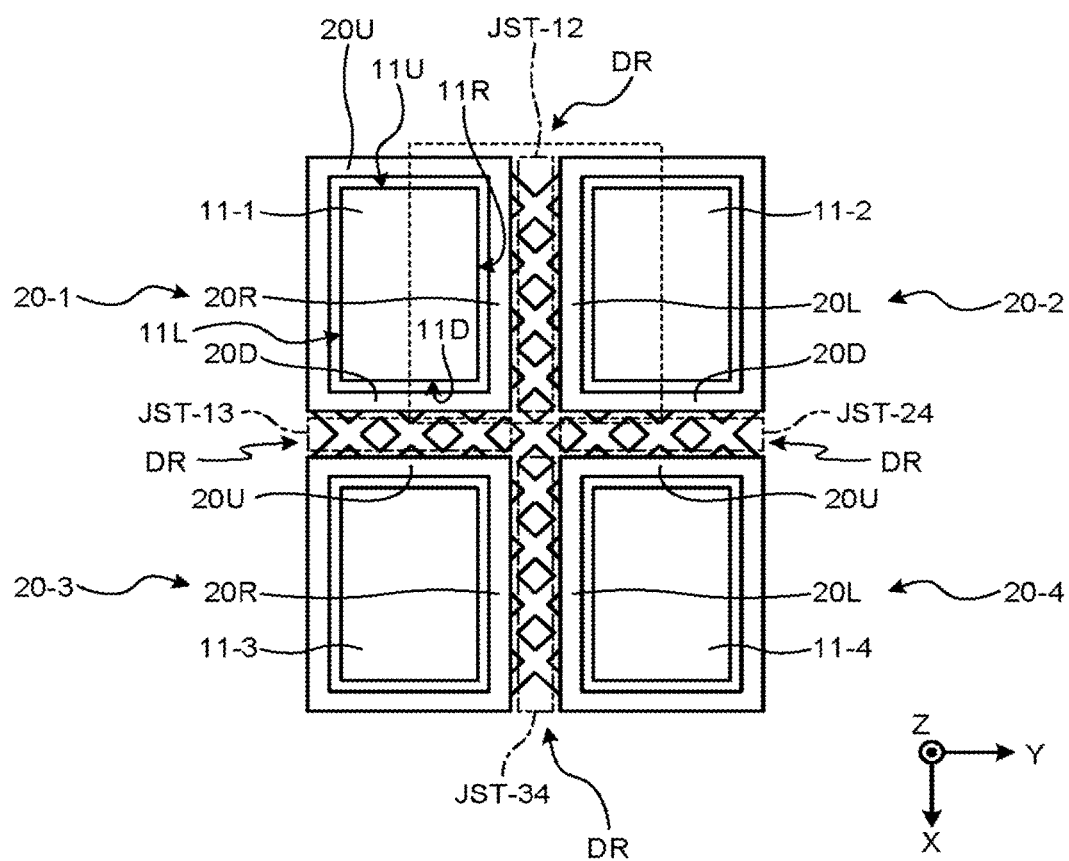
FIGS. 1B and 1C are enlarged plane views illustrating a joist structure according to an embodiment.
Figure 1C:
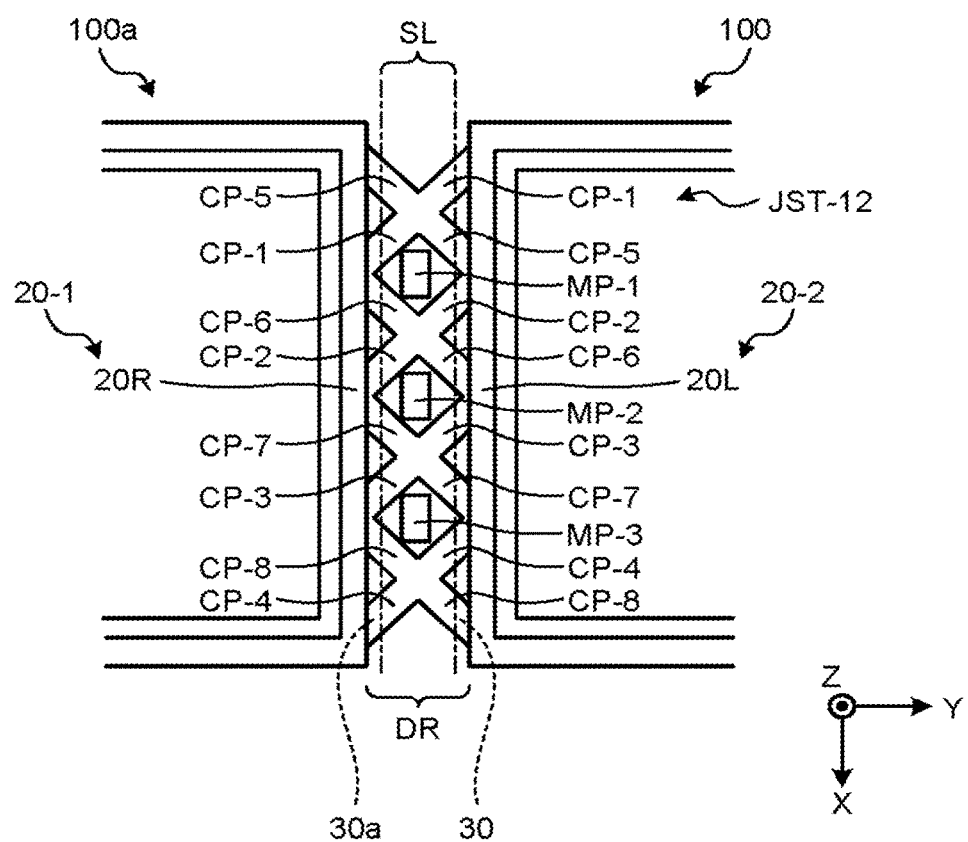

In this regard, in the present embodiment, the occurrence of warpage in the semiconductor wafer WF is reduced such that guard rings of chip regions on the semiconductor wafer WF are mechanically connected by a joist structure JST as illustrated in FIGS. 1A to 1C, and the joist structure JST is configured to generate a stress that reduces warpage. FIG. 1A is a plane view illustrating a semiconductor wafer WF. FIG. 1B is an enlarged plane view illustrating a joist structure JST, that is, an enlarged plane view illustrating a region surrounded by a dotted line in FIG. 1A. FIG. 1C is an enlarged plane view illustrating the joist structure JST, that is, an enlarged plane view illustrating a region surrounded by a dotted line in FIG. 1B. In FIGS. 1A to 1C, a radial direction passing through a notch NT in the semiconductor wafer WF is assumed to an X direction, a direction perpendicular to the surface of the semiconductor wafer WF is assumed to be a Z direction, and a direction perpendicular to the X direction and the Z direction is assumed to be a Y direction.

A plurality of chip regions 11 are arranged in the semiconductor wafer WF at a planar view as illustrated in FIG. 1A. Dicing regions DR extends in the X direction and the Y direction among a plurality of chip regions 11 in the form of a lattice. For example, a plurality of chip regions 11 are two-dimensionally arranged on the semiconductor wafer WF. The dicing region DR is a region cut when a semiconductor device 100 (see FIG. 8A) is cut out from the semiconductor wafer WF through a scribing process.

Each chip region 11 is a region in which a certain circuit element in the semiconductor device 100 to be cut out is formed, that is, a region including a certain multi-layer interconnection structure formed on a surface 10a (see FIG. 8B) of the semiconductor substrate 10 and a certain semiconductor region formed near the surface 10a in the semiconductor substrate 10. The surface 10a of the semiconductor substrate 10 corresponds to a surface WFa of the semiconductor wafer WF (see FIG. 2B).

For example, each chip region 11 has a rectangular shape at a planar view as illustrated in FIG. 1B. For example, the chip region 11 includes four sides 11L to 11D. The side 11L is the left side of the chip region 11 in FIG. 1B. The side 11R is the right side of the chip region 11 in FIG. 1B. The side 11U is the upper side of the chip region 11 in FIG. 1B. The side 11D is the lower side of the chip region 11 in FIG. 1B.

Each chip region 11 is surrounded by a guard ring 20 at a planar view. For example, chip regions 11-1 to 11-4 are surrounded by guard rings 20-1 to 20-4 at a planar view as illustrated in FIG. 1B. The guard ring 20 is arranged around the chip region 11 at a planar view. For example, the guard ring 20 extends in an annular form near the outer circumference of the chip region 11 to surround the chip region 11. Thus, the guard ring 20 protects the chip region 11 by absorbing a stress transferred from a cut section (a side surface 10b illustrated in FIG. 8B) and thus preventing a crack from extending up to the inside of the chip region 11 when the semiconductor device 100 is cut out from the semiconductor wafer WF by the scribing process. For example, the guard ring 20 is formed such that a film made of similar material to a film deposited on the chip region 11 is deposited (see FIG. 7).

For example, the guard ring 20 includes four portions 20L to 20U. The portion 20L is a portion extending along the side 11L of the chip region 11. The portion 20R is a portion extending along the side 11R of the chip region 11. The portion 20U is a portion extending along the side 11U of the chip region 11. The portion 20D is a portion extending along the side 11D of the chip region 11.

The guard rings 20 adjacent to each other at a planar view are mechanically connected through the joist structure JST. The joist structure JST is arranged in the dicing region DR. For example, a specific width, angle, and forming material of the joist structure JST are selected as an appropriate shape is selected as a size and an aspect ratio of the chip region 11.

For example, the portion 20R extending along the guard ring 20-2 in the guard ring 20-1 is mechanically connected with the portion 20L extending along the guard ring 20-1 in the guard ring 20-2 through a joist structure JST-12 as illustrated in FIG. 1B. The portion 20D extending along the guard ring 20-3 in the guard ring 20-1 is mechanically connected with the portion 20U extending along the guard ring 20-1 in the guard ring 20-3 through a joist structure JST-13. The portion 20D extending along the guard ring 20-4 in the guard ring 20-2 is mechanically connected with the portion 20U extending along the guard ring 20-2 in the guard ring 20-4 through a joist structure JST-24. The portion 20R extending along the guard ring 20-4 in the guard ring 20-3 is mechanically connected with the portion 20L extending along the guard ring 20-3 in the guard ring 20-4 through a joist structure JST-34.

Each of the joist structures JST includes a number of connection patterns CP that connect the guard rings 20 adjacent to each other at a planar view. For example, the joist structure JST-12 includes a number of connection patterns CP-1 to CP-8 that connect the portion 20R of the guard ring 20-1 with the portion 20L of the guard ring 20-2 as illustrated in FIG. 1C.

A number of connection patterns CP-1 to CP-8 are arranged in the dicing region DR. It is necessary to arrange mark patterns MP-1 to MP-3 used to manage an overlay or a dimension in the dicing region DR. Thus, a number of connection patterns CP-1 to CP-8 extend between the portion 20R of the guard ring 20-1 and the portion 20L of the guard ring 20-2 not to overlap the mark patterns MP-1 to MP-3 arranged between the portion 20R of the guard ring 20-1 and the portion 20L of the guard ring 20-2. In other words, the mark patterns MP-1 to MP-3 are arranged in gaps in the joist structure JST-12 at a planar view.

The connection pattern CP-1 connects a -X end side of the portion 20R of the guard ring 20-1 with a -X end side of the portion 20L of the guard ring 20-2. The connection pattern CP-4 connects a +X end side of the portion 20R of the guard ring 20-1 with a +X end side of the portion 20L of the guard ring 20-2. The connection pattern CP-2 and the connection pattern CP-3 connect the portion 20R of the guard ring 20-1 with the portion 20L of the guard ring 20-2 between the connection pattern CP-1 and the connection pattern CP-4.

The connection patterns CP-1 to CP-4 extend obliquely to the longitudinal direction (the X direction) of the portion 20R of the guard ring 20-1. In other words, the connection patterns CP-1 to CP-4 bridge the portion 20R of the guard ring 20-1 and the portion 20L of the guard ring 20-2 in a direction oblique to the X direction. For example, the connection patterns CP-1 to CP-4 extend substantially in parallel to one another. In the longitudinal direction (the X direction) of the portion 20R of the guard ring 20-1, an interval between the connection pattern CP-1 and the connection pattern CP-2, an interval between the connection pattern CP-2 and the connection pattern CP-3, an interval between the connection pattern CP-3 and the connection pattern CP-4 are substantially equal to one another.

The connection pattern CP-5 extends to intersect with the connection pattern CP-1. The connection pattern CP-5 connects the -X end side of the portion 20R of the guard ring 20-1 with the -X end side of the portion 20L of the guard ring 20-2. The connection pattern CP-8 extends to intersect with the connection pattern CP-4. The connection pattern CP-8 connects the +X end side of the portion 20R of the guard ring 20-1 with the +X end side of the portion 20L of the guard ring 20-2. The connection pattern CP-6 extends to intersect with the connection pattern CP-2. The connection pattern CP-7 extends to intersect with the connection pattern CP-3. The connection pattern CP-6 and the connection pattern CP-7 connect the portion 20R of the guard ring 20-1 with the portion 20L of the guard ring 20-2 between the connection pattern CP-5 and the connection pattern CP-8.

In other words, the connection pattern CP-1 and the connection pattern CP-5 form substantially a letter X shape at a planar view. The connection pattern CP-2 and the connection pattern CP-6 form substantially a letter X shape at a planar view. The connection pattern CP-3 and the connection pattern CP-7 form substantially a letter X shape at a planar view. The connection pattern CP-4 and the connection pattern CP-8 form substantially a letter X shape at a planar view.

The connection patterns CP-5 to CP-8 extend obliquely to the longitudinal direction (the X direction) of the portion 20R of the guard ring 20-1. In other words, the connection patterns CP-5 to CP-8 bridge the portion 20R of the guard ring 20-1 and the portion 20L of the guard ring 20-2 in a direction oblique to the X direction. For example, the connection patterns CP-5 to CP-8 extend substantially in parallel to one another. An interval between the connection pattern CP-5 and the connection pattern CP-6, an interval between the connection pattern CP-6 and the connection pattern CP-7, and an interval between the connection pattern CP-7 and the connection pattern CP-8 in the longitudinal direction (the X direction) of the portion 20R of the guard ring 20-1 are substantially equal to one another.

Further, a number of connection patterns CP-1 to CP-8 are formed of a material that is suitable for generating a tensile stress or a compressive stress according to a warping state of the semiconductor wafer WF. Thus, the joist structure JST can have a stress that reduces warpage.

Figure 2A:
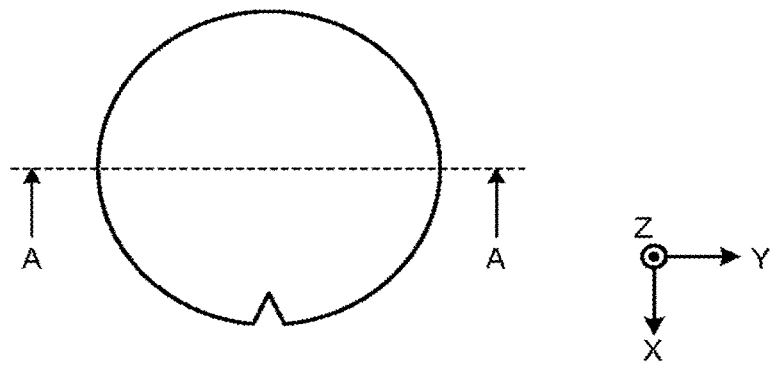
FIG. 2A is a plane view illustrating a semiconductor wafer according to an embodiment.
Figure 2B:
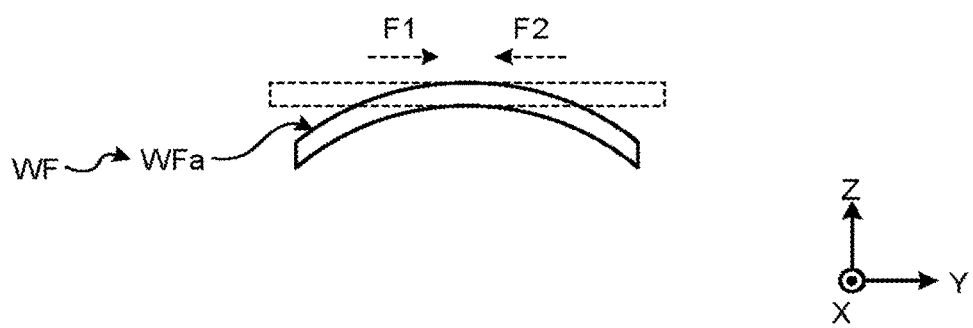
FIG. 2B is a cross-sectional view illustrating a warping state of a semiconductor wafer according to an embodiment.

For example, when the semiconductor wafer WF is deformed such that the surface WFa side is convex as illustrated in FIGS. 2A and 2B, a number of connection patterns CP in the joist structure JST are formed of a material that is suitable for generating a compressive stress. FIG. 2A is a plane view illustrating the semiconductor wafer WF. FIG. 2B is a cross-sectional view (a Y-Z cross-sectional view) taken along line A-A in FIG. 2A, that is, a cross-sectional view illustrating the warping state of the semiconductor wafer WF.

For example, since the joist structure JST has the compressive stress, a silicon nitride film may be formed as a film of forming a number of connection patterns CP in the joist structure JST, and the silicon nitride film may be deposited under the following film forming condition. As the film forming condition, for example, silane ($SiH_4$) is supplied at a flow rate of 100 sccm to 1000 sccm as a silicon source, $NH_3$ is supplied at a flow rate of 500 sccm to 10000 sccm as an N source, and $N_2$ or Ar is supplied at a flow rate of 500 sccm to 10000 sccm as carrier gas. Further, a plasma CVD in which pressure is set to 0.1 Torr to 400 Torr, a substrate temperature is set to 400° C. to 450° C., and radio frequency (RF) power is set to 100 W to 1000 W is performed. The compressive stress is, for example, 2.5 GPa.

Figure 2C:
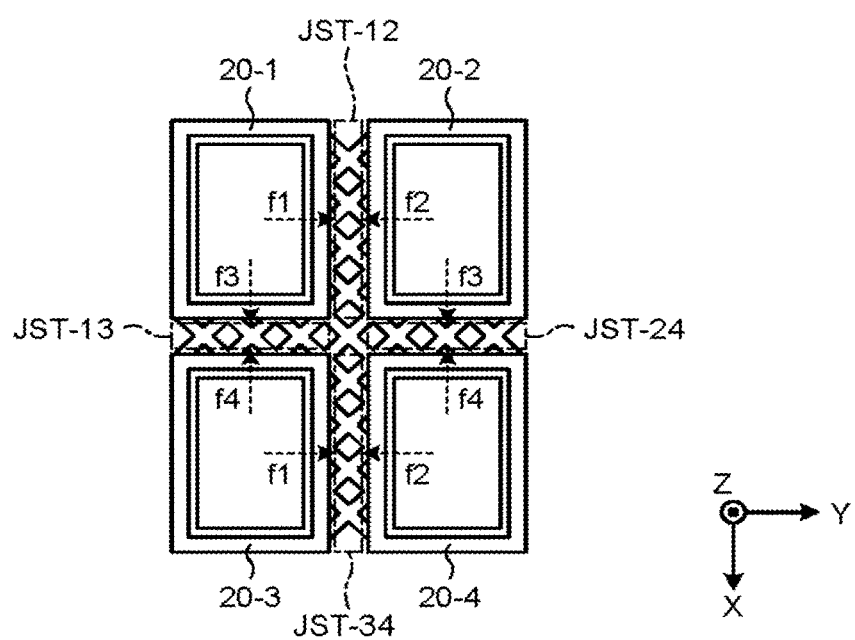
FIG. 2C is an enlarged plane view illustrating a joist structure according to an embodiment.

Thus, for example, the joist structures JST-12 and JST-34 can generate a stress f1 of pulling the guard rings 20-1 and 20-3 in the +Y direction and a stress f2 of pulling the guard rings 20-2 and 20-4 in the −Y direction as indicated by dotted line arrows in FIG. 2C. FIG. 2C is an enlarged plane view corresponding to FIG. 1B, that is, an enlarged plane view illustrating the joist structure JST. As a result, for example, as indicated by dotted line arrows in FIG. 2B, resultant force F1 and F2 of the stresses f1 and f2 of a plurality of joist structures JST can be generated, and the surface WFa of the semiconductor wafer WF can be pulled to the center side of the semiconductor wafer WF by the resultant force F1 and F2. Accordingly, the warpage of the semiconductor wafer WF can be reduced as indicated by a dotted line in FIG. 2B.

Similarly, the joist structures JST-13 and JST-24 can generate a stress f3 of pulling the guard rings 20-1 and 20-2 in the +X direction and a stress f4 of pulling the guard rings 20-3 and 20-4 in the −X direction as indicated by dotted line arrows in FIG. 2C. As a result, for example, although not illustrated, resultant force F3 and F4 of the stresses f3 and f4 of a plurality of joist structures JST can be generated, and the surface WFa of the semiconductor wafer WF can be pulled to the center side of the semiconductor wafer WF by the resultant force F3 and F4. Accordingly, the warpage of the semiconductor wafer WF can be reduced.

Alternatively, when the semiconductor wafer WF is deformed such that a back surface WFb is convex as illustrated in FIGS. 3A and 3B, a number of connection patterns CP in the joist structure JST is formed of a material that is suitable for generating a tensile stress. FIG. 3A is a plane view illustrating the semiconductor wafer WF. FIG. 3B is a cross-sectional view (a Y-Z cross-sectional view) taken along line B-B in FIG. 3A, that is, a cross-sectional view illustrating the warping state of the semiconductor wafer WF.

For example, in order to cause the joist structure JST to have a tensile stress, a silicon nitride film may be formed as a film of forming a number of connection patterns CP in the joist structure JST, and the silicon nitride film may be deposited under the following film forming condition. For example, a thermal CVD is performed under the film forming condition in which any one of dichlorosilane ($SiCl_2H_2$), silane ($SiH_4$), disilane ($Si_2H_6$), and trisilane ($Si_3H_8$) is supplied at a flow rate of 5 sccm to 50 sccm as a silicon source, $NH_3$ is supplied at a flow rate of 500 sccm to 10000 sccm as an N source, $N_2$ or Ar is supplied at a flow rate of 500 sccm to 10000 sccm as carrier gas, pressure is set to 0.1 Torr to 400 Torr, and a substrate temperature is set to 400° C. to 450° C. The tensile stress is, for example, 1.7 GPa.

Figure 3C:
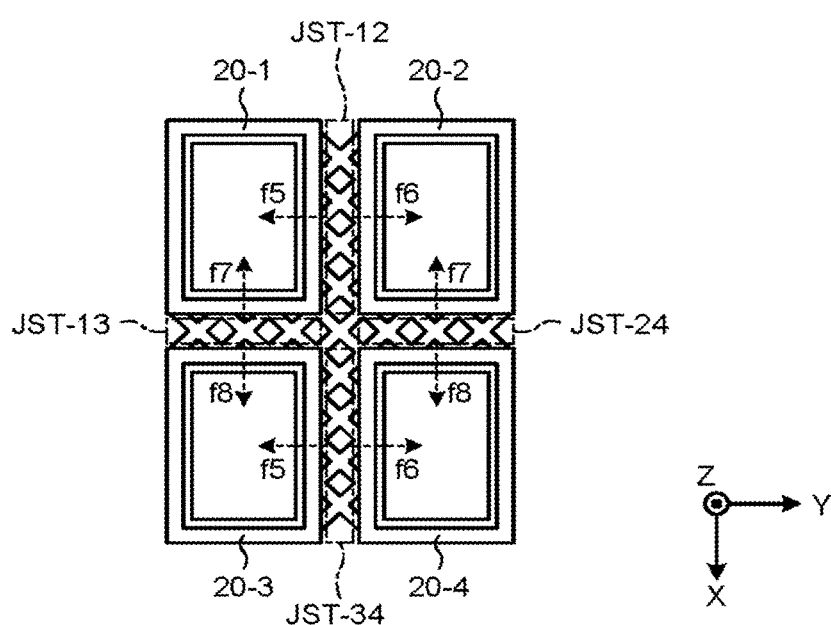
FIG. 3C is an enlarged plane view illustrating a joist structure according to an embodiment.

Thus, for example, the joist structures JST-12 and JST-34 can generate a stress f5 of pushing the guard rings 20-1 and 20-3 in the −Y direction and a stress f6 of pushing the guard rings 20-2 and 20-4 in the +Y direction as indicated by dotted line arrows in FIG. 3C. FIG. 3C is an enlarged plane view corresponding to FIG. 1B, that is, an enlarged plane view illustrating the joist structure JST. As a result, for example, as indicated by dotted line arrows in FIG. 3B, resultant force F5 and F6 of the stresses f5 and f6 of a plurality of joist structures JST can be generated, and the surface WFa of the semiconductor wafer WF can be pushed to the peripheral side of the semiconductor wafer WF by the resultant force F5 and F6. Accordingly, the warpage of the semiconductor wafer WF can be reduced as indicated by a dotted line in FIG. 3B.

Similarly, the joist structures JST-13 and JST-24 can generate a stress f7 of pushing the guard rings 20-1 and 20-2 in the −X direction and a stress f8 of pushing the guard rings 20-3 and 20-4 in the +X direction as indicated by dotted line arrows in FIG. 3C. As a result, for example, although not illustrated, the resultant force F7 and F8 of the stresses f7 and f8 of a plurality of joist structures JST can be generated, and the surface WFa of the semiconductor wafer WF can be pushed to the peripheral side of the semiconductor wafer WF by the resultant force F7 and F8. Accordingly, the warpage of the semiconductor wafer WF can be reduced.

Alternatively, for example, when the semiconductor wafer WF is deformed in a saddle shape as illustrated in FIGS. 4A to 4C and FIG. 5, the joist structures JST-12 and JST-34 formed of a material that is suitable for generating a compressive stress are combined with the joist structures JST-13 and JST-24 formed of a material that is suitable for generating a tensile stress. FIG. 4A is a plane view illustrating the semiconductor wafer WF. FIG. 4B is a cross-sectional view (a Y-Z cross-sectional view) taken along line C-C in FIG. 4A, that is, a cross-sectional view illustrating the warping state of the semiconductor wafer WF. FIG. 4C is a cross-sectional view (an X-Z cross-sectional view) taken along line D-D in FIG. 4A, that is, a cross-sectional view illustrating the warping state of the semiconductor wafer WF. FIG. 5 is a perspective view illustrating the warping state of the semiconductor wafer WF.

For example, in order to cause the joist structures JST-12 and JST-34 to have a compressive stress, a silicon nitride film may be formed as a film of forming a number of connection patterns CP in the joist structures JST-12 and JST-34, and the silicon nitride film may be deposited under the following film forming condition. As the film forming condition, for example, silane ($SiH_4$) is supplied at a flow rate of 100 sccm to 1000 sccm as a silicon source, $NH_3$ is supplied at a flow rate of 500 sccm to 10000 sccm as an N source, and $N_2$ or Ar is supplied at a flow rate of 500 sccm to 10000 sccm as carrier gas. Further, a plasma CVD in which pressure is set to 0.1 Torr to 400 Torr, a substrate temperature is set to 400° C. to 450° C., and radio frequency (RF) power is set to 100 W to 1000 W is performed. The compressive stress is, for example, 2.5 GPa.

Further, in order to cause the joist structures JST-13 and JST-24 to have a tensile stress, a silicon nitride film may be formed as a film of forming a number of connection patterns CP in the joist structures JST-13 and JST-24, and the silicon nitride film may be deposited under the following film forming condition. For example, a thermal CVD is performed under the film forming condition in which any one of dichlorosilane ($SiCl_2H_2$), silane ($SiH_4$), disilane ($Si_2H_6$), and trisilane ($Si_3H_8$) is supplied at a flow rate of 5 sccm to 50 sccm as a silicon source, $NH_3$ is supplied at a flow rate of 500 sccm to 10000 sccm as an N source, $N_2$ or Ar is supplied at a flow rate of 500 sccm to 10000 sccm as carrier gas, pressure is set to 0.1 Torr to 400 Torr, and a substrate temperature is set to 400° C. to 450° C. The tensile stress is, for example, 1.7 GPa.

Thus, for example, the joist structures JST-12 and JST-34 can generate a stress f11 of pulling the guard rings 20-1 and 20-3 in the +Y direction and a stress f12 of pulling the guard rings 20-2 and 20-4 in the −Y direction as indicated by dotted line arrows in FIG. 4D. FIG. 4D is an enlarged plane view corresponding to FIG. 1B, that is, an enlarged plane view illustrating the joist structure JST. As a result, for example, as indicated by dotted line arrows in FIG. 4B, resultant force F11 and F12 of the stresses f11 and f12 of a plurality of joist structures JST can be generated, and the surface WFa of the semiconductor wafer WF can be pulled to the center side of the semiconductor wafer WF by the resultant force F11 and F12. Accordingly, the warpage of the semiconductor wafer WF can be reduced as indicated by a dotted line in FIG. 4B.

Further, the joist structures JST-13 and JST-24 can generate a stress f13 of pushing the guard rings 20-1 and 20-2 in the −X direction and a stress f14 of pushing the guard rings 20-3 and 20-4 in the +X direction as indicated by dotted line arrows in FIG. 4D. As a result, for example, as indicated by dotted line arrows in FIG. 4C, resultant force F13 and F14 of the stresses f13 and f14 of a plurality of joist structures JST can be generated, and the surface WFa of the semiconductor wafer WF can be pushed to the peripheral side of the semiconductor wafer WF by the resultant force F13 and F14. Accordingly, the warpage of the semiconductor wafer WF can be reduced.

Figure 6:
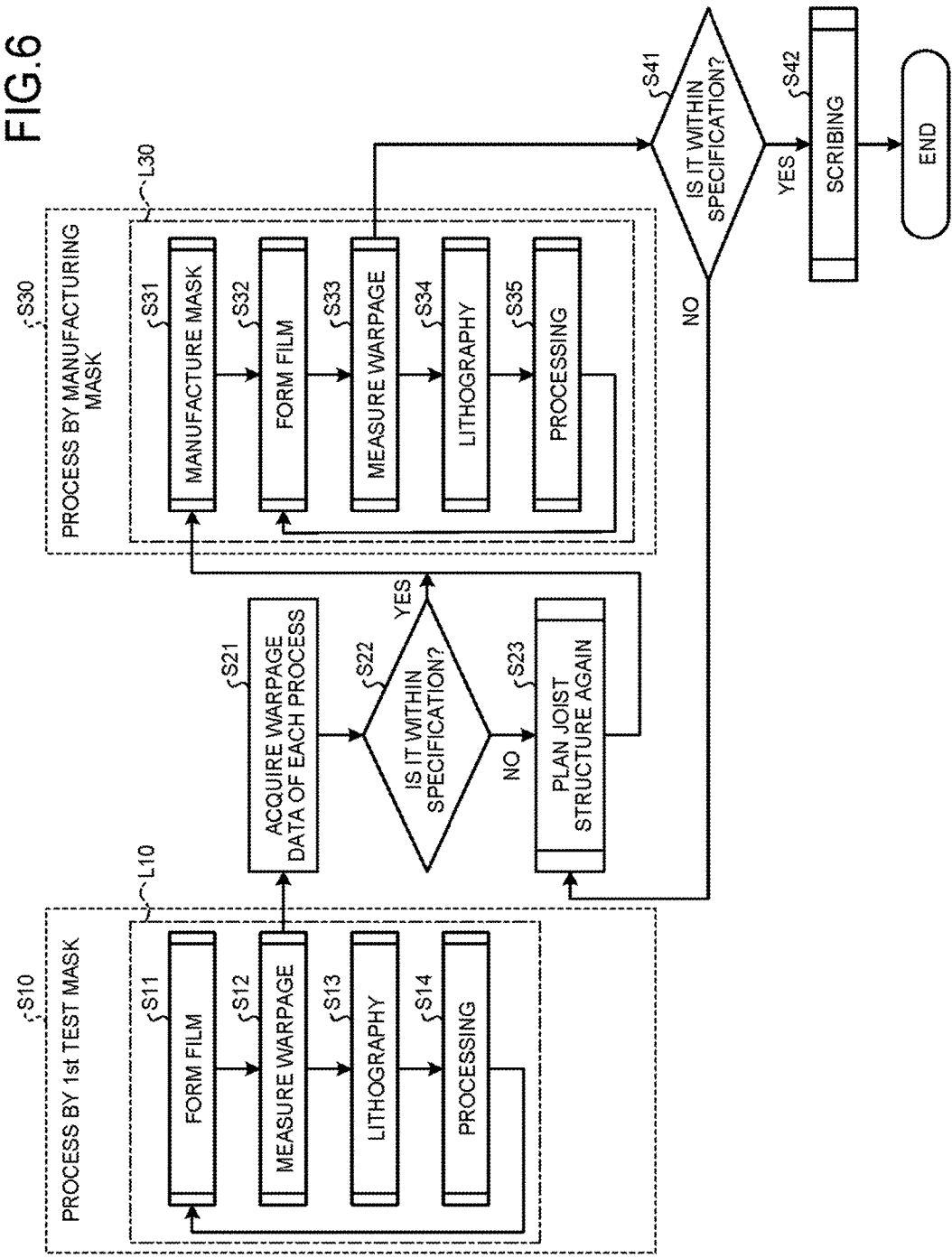
FIG. 6 is a flowchart illustrating a manufacturing method of a semiconductor device according to an embodiment.

Next, a manufacturing method of the semiconductor device 100 (see FIG. 8A) including a process of forming the joist structure JST will be described with reference to FIG. 6. FIG. 6 is a flowchart illustrating a manufacturing method of a semiconductor device.

A process (S10) by a test mask is performed as preparation of a process (S30) by a manufacturing mask. Specifically, a certain film is formed on a semiconductor wafer WF (S11), and the shape of the semiconductor wafer WF is measured. In other words, the warpage amount distribution is measured along the surface of the semiconductor wafer WF (S12). For example, the warpage amount distribution can be measured by detecting a displacement at a plurality of positions on the surface of the semiconductor wafer WF through a laser displacement gauge. A measurement result of the warpage amount distribution is 3D information (see FIG. 5). Thereafter, a lithography process (S13) is performed using a test mask including a device pattern, a pattern of the guard ring 20, and a pattern of the joist structure JST. In other words, a certain film is coated with a resist solution, an exposure process of transferring a mask pattern, that is, the device pattern, the pattern of the guard ring 20, and the pattern of the joist structure JST onto the resist film, and a latent image pattern is formed on the resist film. Thereafter, the latent image pattern is developed. Then, etching is performed using a developed pattern as a mask to process the pattern of the guard ring 20 and the pattern (a number of connection patterns CP) of the joist structure JST in the certain film (S14). By repeating a loop L10 of S11 to S14, the guard ring 20 and the joist structure JST are formed on the semiconductor wafer WF, for example, with similar layer structure to that illustrated in FIG. 7. At least one of a plurality of layers configuring the joist structure JST is formed of a film having a stress that reduces warpage. FIG. 7 is a perspective view illustrating the layer structure of the guard ring 20 and the joist structure JST. In FIG. 7, for simplicity of illustration, the joist structure JST is illustrated by two connection patterns.

For example, in order to cause the joist structure JST to generate a compressive resistance to warpage, a silicon nitride film may be formed as a film of forming a number of connection patterns CP in the joist structure JST, and the silicon nitride film may be deposited under the following film forming condition. As the film forming condition, for example, silane (SiH$_4$) is supplied at a flow rate of 100 sccm to 1000 sccm as a silicon source, NH$_3$ is supplied at a flow rate of 500 sccm to 10000 sccm as an N source, and N$_2$ or Ar is supplied at a flow rate of 500 sccm to 10000 sccm as carrier gas. Further, a plasma CVD in which pressure is set to 0.1 Torr to 400 Torr, a substrate temperature is set to 400° C. to 450° C., and radio frequency (RF) power is set to 100 W to 1000 W is performed. The compressive stress is, for example, 2.5 GPa.

For example, in order to cause the joist structure JST to generate a tensile resistance to warpage, a silicon nitride film may be formed as a film of forming a number of connection patterns CP in the joist structure JST, and the silicon nitride film may be deposited under the following film forming condition. For example, a thermal CVD is performed under the film forming condition in which any one of dichlorosilane (SiCl$_2$H$_2$), silane (SiH$_4$), disilane (Si$_2$H$_6$), and trisilane (Si$_3$H$_8$) is supplied at a flow rate of 5 sccm to 50 sccm as a silicon source, NH$_3$ is supplied at a flow rate of 500 sccm to 10000 sccm as an N source, N$_2$ or Ar is supplied at a flow rate of 500 sccm to 10000 sccm as carrier gas, pressure is set to 0.1 Torr to 400 Torr, and a substrate temperature is set to 400° C. to 450° C. The tensile stress is, for example, 1.7 GPa.

It should be noted that, for example, when the joist structures JST-12 and JST-34 formed of a material that is suitable for generating a compressive stress is combined with the joist structures JST-13 and JST-24 formed of a material that is suitable for generating a tensile stress (see FIG. 4D), one of the joist structures JST-12 and JST-34 and the joist structures JST-13 and JST-24 may be formed by similar process to that of the device pattern and the pattern of the guard ring 20, and the other may be formed by a process different from that of the device pattern and the pattern of the guard ring 20.

When the loop L10 of S11 to S14 is repeated, the measurement result of S12 in each loop L10 is acquired (S21), and when the process (S10) by the test mask ends, it is determined whether or not the measurement result of S12 in each loop L10 satisfies specification requirements (S22). When the measurement result of S12 in each loop L10 does not satisfy the specification requirements, that is, when it is out of the specification (No in S22), the pattern (a number of connection patterns CP) of the joist structure JST is planned again and changed to a pattern capable of further reducing warpage (S23).

On the other hand, when the measurement result of S12 in each loop L10 satisfies the specification requirements, that is, it is within the specification (Yes in S22), the process proceeds to the process (S30) by the manufacturing mask. Specifically, when the manufacturing mask including the device pattern, the pattern of the guard ring 20, and the pattern of the joist structure JST is manufactured (S31), a certain film is formed on the semiconductor wafer WF (S32), and the shape of the semiconductor wafer WF is measured. In other words, the warpage amount distribution is measured along the surface of the semiconductor wafer WF (S33). For example, the warpage amount distribution can be measured by detecting a displacement at a plurality of positions on the surface of the semiconductor wafer WF through a laser displacement gauge. A measurement result of the warpage amount distribution is 3D information (see FIG. 5). Thereafter, the lithography process (S34) is performed using the manufacturing mask including the device pattern, the pattern of the guard ring 20, and the pattern of the joist structure JST. In other words, a certain film is coated with a resist solution, an exposure process of transferring a mask pattern, that is, the device pattern, the pattern of the guard ring 20, and the pattern of the joist structure JST onto the resist film, and a latent image pattern is formed on the resist film. Thereafter, the latent image pattern is developed. Then, etching is performed using a developed pattern as a mask to process the fine device pattern, the pattern of the guard ring 20, and the pattern (a number of connection patterns CP) of the joist structure JST in the certain film (S35). By repeating a loop L30 of S32 to S35, a semiconductor integrated circuit is formed in the chip region 11 on the semiconductor wafer WF, the guard ring 20 is formed around the chip region 11, and the joist structure JST is formed in the dicing region DR. At this time, the measurement result of S33 in each loop is acquired, and when the process (S30) by the manufacturing mask ends, it is determined whether or not the measurement result of S33 in each loop L30 satisfies the specification requirements (S41). When the measurement result of S33 in each loop L30 does not satisfy the specification requirements, that is, when it is out of the specification (No in S41), the pattern (a number of connection patterns CP) of the joist structure JST is planned again and changed to a pattern capable of reducing warpage (S23), and the process (S30) by the manufacturing mask is performed again.

Figure 8A:
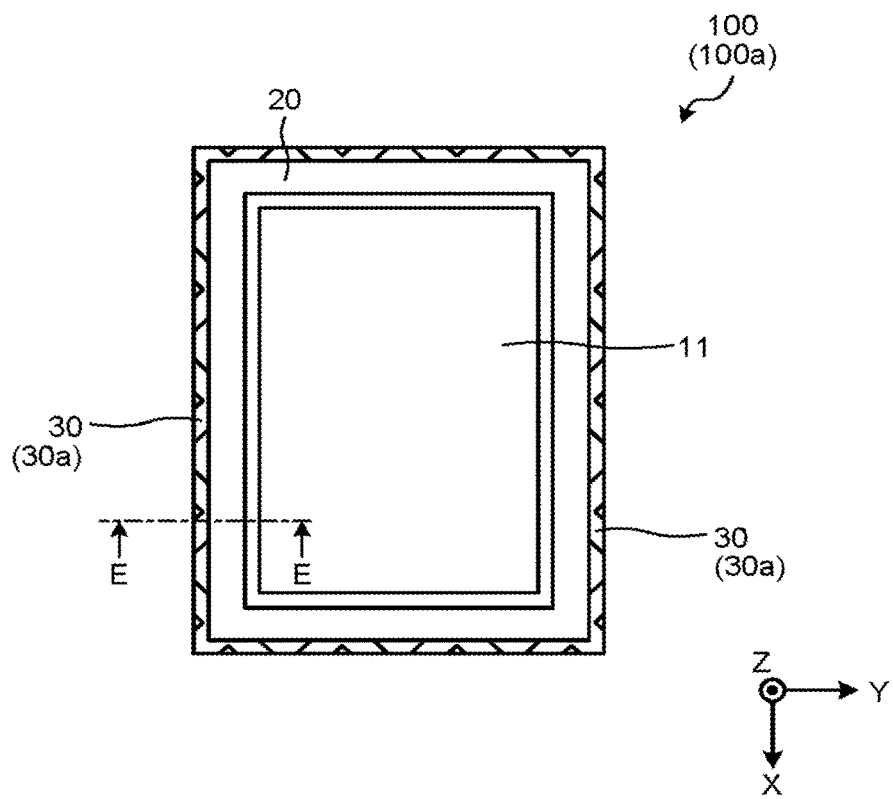
FIG. 8A is a plane view illustrating a configuration of a semiconductor device according to an embodiment.
Figure 8B:
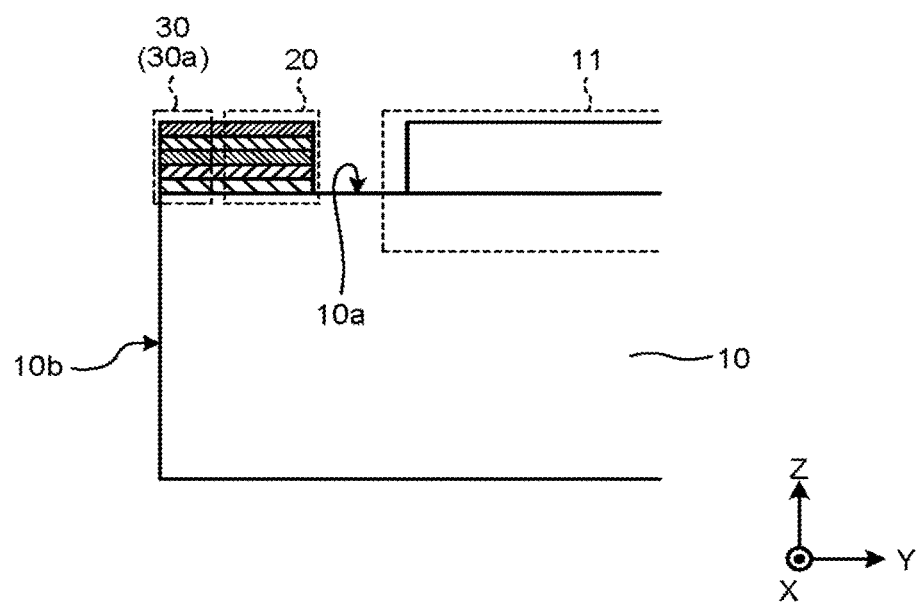
FIG. 8B is a cross-sectional view illustrating a configuration of a semiconductor device according to an embodiment.

On the other hand, when the measurement result of S33 in each loop L30 satisfies the specification requirements, that is, when it is within the specification (Yes in S41), the semiconductor wafer WF is cut along a scribe line SL (see FIG. 1C) (S42), and the semiconductor wafer WF is divided into a plurality of semiconductor devices 100 and 100a. At this time, the joist structure JST is divided into a joist structure piece 30 serving as a part of the semiconductor device 100 and a joist structure piece 30a serving as a part of the semiconductor device 100a. As a result, a plurality of the semiconductor devices 100 and 100a illustrated in FIGS. 8A and 8B are obtained. FIG. 8A is a plane view illustrating a configuration of the semiconductor device 100. FIG. 8B is a cross-sectional view (a Y-Z cross-sectional view) taken along line E-E in FIG. 8A, and illustrates that the guard ring 20 and the joist structure piece 30 have the same layer structure.

As described above, in the embodiment, the guard rings 20 of the chip regions 11 on the semiconductor wafer WF are mechanically connected through the joist structure JST, and the joist structure JST has a stress that reduces warpage. Thus, since the warpage of the semiconductor wafer WF can be reduced, it is possible to reduce the semiconductor wafer WF conveyance trouble by the apparatus and improve the overlay accuracy of each process, and it is possible to contribute to an increase in the number of stacked layers and the yield of the semiconductor integrated circuit.

It should be noted that, in order to cause the joist structure JST to have a compressive stress, a silicon oxide film may be used as a film of forming a number of connection patterns CP in the joist structure JST instead of a silicon nitride film. In this case, the silicon oxide film may be deposited under the following film forming condition. As the film forming condition, for example, tetramethylsilane (TMS) is supplied at a flow rate of 15 sccm as a silicon source, $N_2O$ is supplied at a flow rate of 450 sccm as an O source. Further, a plasma CVD in which pressure is set to 0.7 Torr, plasma generation power is set to 150 W, a frequency of plasma generation power is set to 13.56 MHz, bias power is set to 150 W, a frequency of bias power is set to 380 kHz, a substrate temperature is set to 330° C., and a film forming rate is set to 150 nm/min is performed. The compressive stress is, for example, $3.3 \times 10^9$ dyne/cm$^2$.

Alternatively, in order to cause the joist structure JST to have a tensile stress, a silicon oxide film may be used as a film of forming a number of connection patterns CP in the joist structure JST instead of the silicon nitride film. In this case, the silicon oxide film may be deposited under the following film forming condition. As the film forming condition, for example, tetraethyl orthosilicate (TEOS) is supplied at a flow rate of 1500 sccm as a silicon source, and $O_3$ is supplied with a density of 5% (in $O_2$ 7.5 L) as an O source. Further, a thermal CVD in which pressure is set to 0.7 Torr, plasma generation power is set to 150 W, a substrate temperature is set to 400° C., and a film forming rate is set to 87 nm/min is performed. The tensile stress is, for example, $2.2 \times 10^9$ dyne/cm$^2$.

Figure 9:
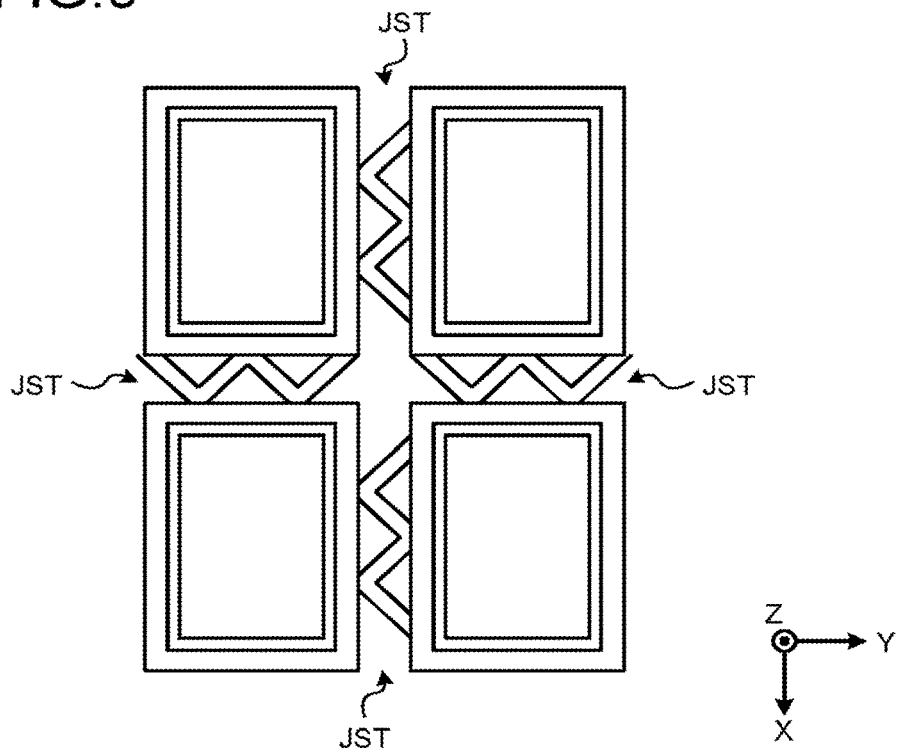
FIG. 9 is an enlarged plane view illustrating a joist structure according to a modified example of an embodiment.
Figure 10:
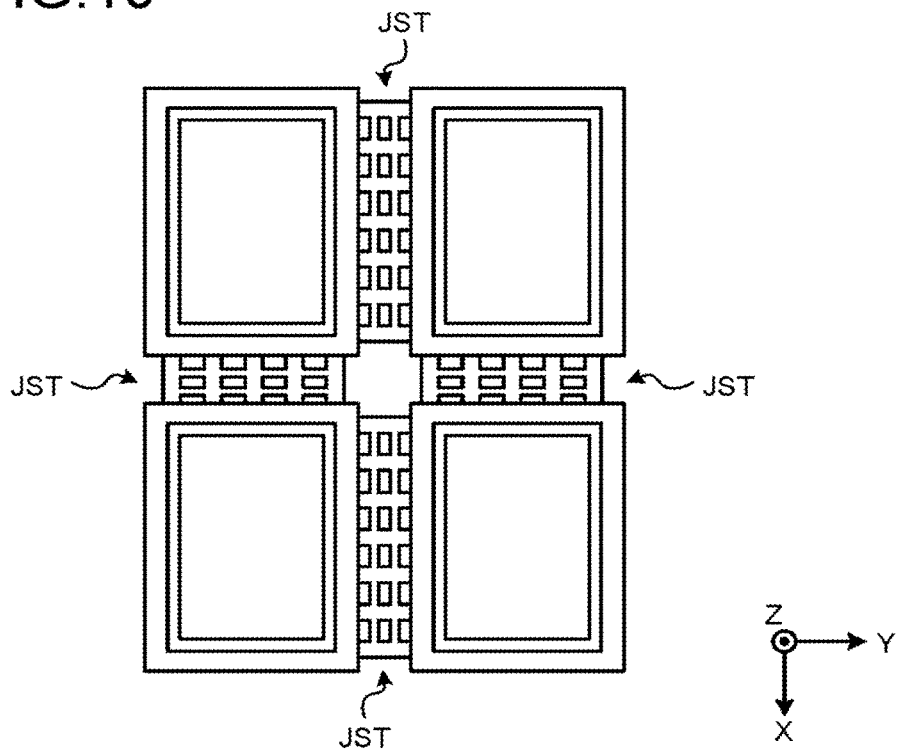
FIG. 10 is an enlarged plane view illustrating a joist structure according to another modified example of an embodiment.
Figure 11:
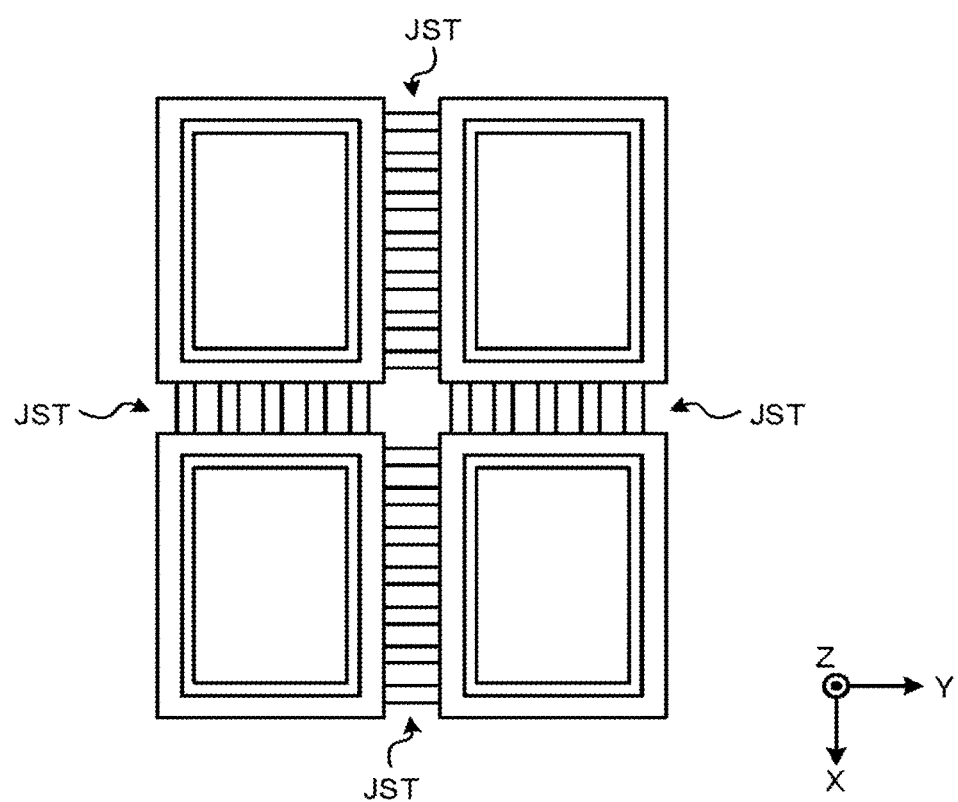
FIG. 11 is an enlarged plane view illustrating a joist structure according to another modified example of an embodiment.

Alternatively, a planar shape of the joist structure JST is not limited to a planar shape (see FIGS. 1B and 1C) in which substantially a letter X shape is repeatedly arranged as long as it is possible to cause the joist structure JST to have a stress that reduces warpage. For example, the joist structure JST may have substantially a letter M shape as illustrated in FIG. 9, a lattice shape as illustrated in FIG. 10, or a bridge shape substantially orthogonal to a connecting portion of the guard ring 20 as illustrated in FIG. 11.

Figure 12:
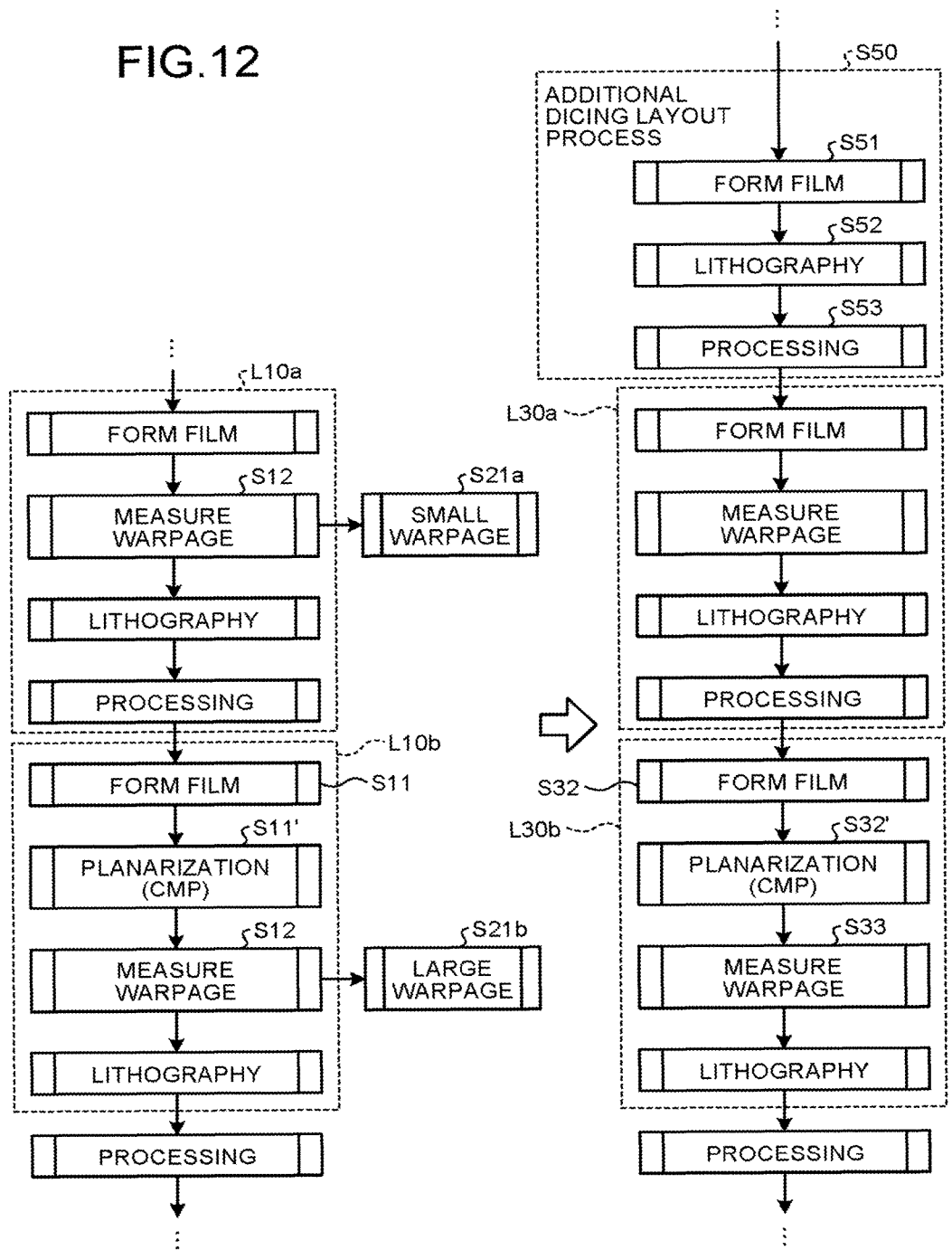
FIG. 12 is a flowchart illustrating a manufacturing method of a semiconductor device according to a modified example of an embodiment.

Alternatively, in the manufacturing method of the semiconductor device 100 (see FIG. 8A), the pattern of the joist structure JST may be formed in a process different from that of the device pattern. For example, as illustrated in FIG. 12, a result of a measurement (S12) of a warpage amount distribution in loops L10a and L10b in a process S10 by a test mask that does not include the pattern of the joist structure JST may be acquired (S21a and S21b), a process (for example, a planarization process S11' by a CMP technique or the like in L10b) in which the warpage of the semiconductor wafer WF is problematic may be specified, and a process S50 of forming the joist structure JST may be added before a corresponding process (for example, a planarization process S32' by the CMP technique or the like in L30b) in loops L30a and L30b in a process S30 by the manufacturing mask. In the process (an additional dicing layout process) S50 of forming the joist structure JST, a certain film is formed on the semiconductor wafer WF (S51), and the lithography process (S52) is performed using a mask for the joist structure JST. In other words, the certain film is coated with a resist solution, an exposure process of transferring a mask pattern, that is, a pattern of the joist structure JST onto the resist film is performed, and a latent image pattern is formed on the resist film. Thereafter, the latent image pattern is developed. Then, etching is performed using the developed pattern as a mask to process the pattern (a number of connection patterns CP) of the joist structure JST in the certain film (S53).

Figure 13A:
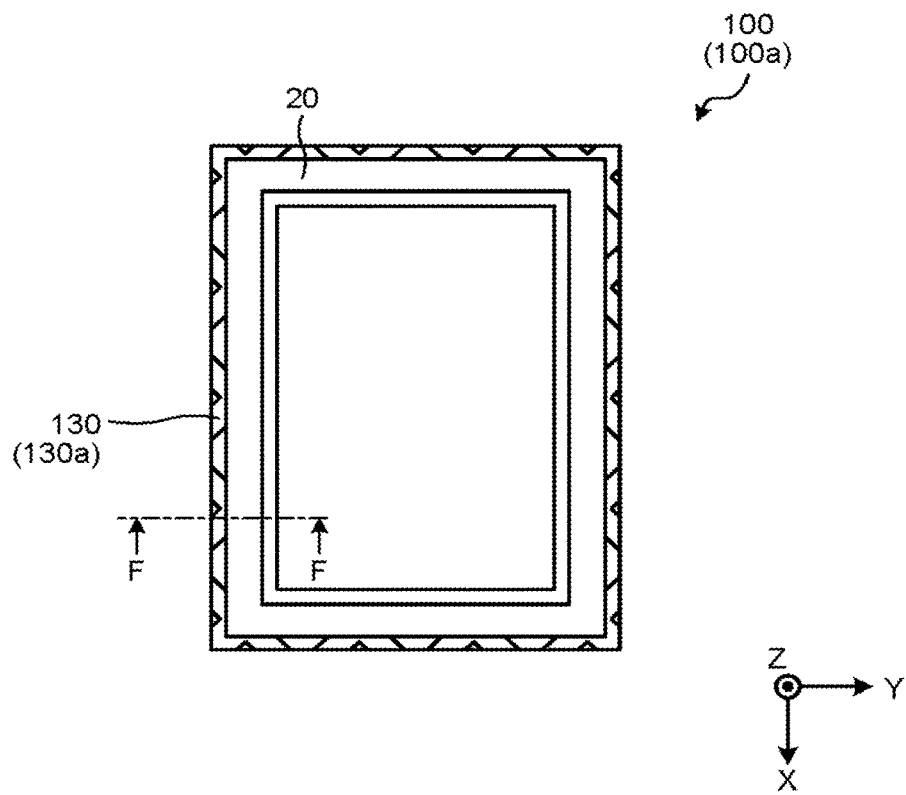
FIG. 13A is a plane view illustrating a configuration of a semiconductor device according to a modified example of an embodiment.
Figure 13B:
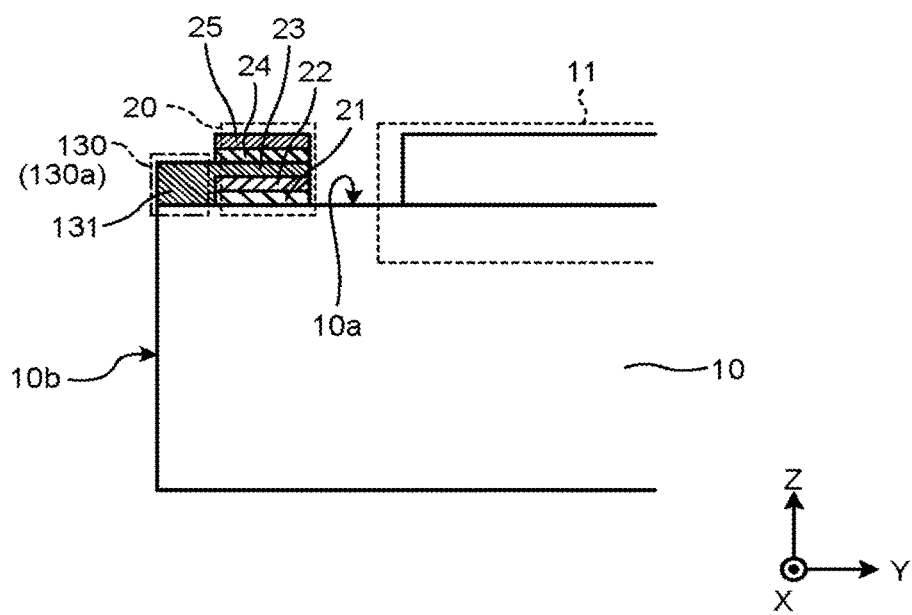
FIG. 13B is a cross-sectional view illustrating a configuration of a semiconductor device according to a modified example of an embodiment.

Alternatively, in the manufacturing method of the semiconductor device 100 (see FIG. 8A), the joist structure JST may be formed in the process of forming at least one of a plurality of layers configuring the guard ring 20. In this case, in the semiconductor device 100 (100a) obtained after scribing (S42), at least one layer 23 among a plurality of layers 21 to 25 configuring the guard ring 20 is connected with a film 131 of a joist structure piece 130 (130a) as illustrated in FIGS. 13A and 13B. The film 131 covers the surface 10a of the semiconductor substrate 10 and has a film thickness corresponding to a total thickness of the layers 21 to 23. The layer 23 and the film 131 are formed in substantially a ladle shape at a cross-sectional view.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:
   forming a first guard ring around a first chip region on a semiconductor wafer;
   forming a second guard ring around a second chip region on the semiconductor wafer; and
   mechanically connecting the first guard ring with the second guard ring through a joist structure,
   wherein the connecting through the joist structure further comprises connecting a first portion with a second portion through a number of connection patterns, the first portion being a straight portion located on a side of the second guard ring in the first guard ring, the second portion being a straight portion located on a side of the first guard ring in the second guard ring,
   wherein the connecting through the joist structure further comprises connecting the first portion with the second portion through a number of the connection patterns not to overlap a mark pattern arranged between the first portion and the second portion.

2. A manufacturing method of a semiconductor device comprising:
   forming a first guard ring around a first chip region on a semiconductor wafer;
   forming a second guard ring around a second chip region on the semiconductor wafer; and
   mechanically connecting the first guard ring with the second guard ring through a joist structure,
   wherein the connecting through the joist structure further comprises connecting a first portion with a second portion through a number of connection patterns, the first portion being a straight portion located on a side of the second guard ring in the first guard ring, the second portion being a straight portion located on a side of the first guard ring in the second guard ring,
   wherein the connecting through the joist structure further comprises
   connecting one end side of the first portion with one end side of the second portion through a first connection pattern,
   connecting another end side of the first portion with another end side of the second portion through a second connection pattern, and
   connecting the first portion with the second portion through a third connection pattern between the first connection pattern and the second connection pattern.

3. The manufacturing method of the semiconductor device according to claim 2,
   wherein each of the first connection pattern, the second connection pattern, and the third connection pattern extends obliquely to a longitudinal direction of the first portion.

4. The manufacturing method of the semiconductor device according to claim 2,
   wherein the connecting through the joist structure further comprises
   connecting the one end side of the first portion with the one end side of the second portion through a fourth connection pattern to intersect with the first connection pattern,
   connecting the other end side of the first portion with the other end side of the second portion through a fifth connection pattern to intersect with the second connection pattern, and
   connecting the first portion with the second portion through a sixth connection pattern between the first connection pattern and the second connection pattern to intersect with the third connection pattern.

5. The manufacturing method of the semiconductor device according to claim 4,
   wherein the first connection pattern and the fourth connection pattern form substantially a letter X shape at a planar view,
   the second connection pattern and the fifth connection pattern form substantially a letter X shape at a planar view, and
   the third connection pattern and the sixth connection pattern form substantially a letter X shape at a planar view.

6. The manufacturing method of the semiconductor device according to claim 2,
   wherein an interval between the first connection pattern and the third connection pattern in a longitudinal direction of the first portion is equivalent to an interval between the third connection pattern and the second connection pattern in the longitudinal direction of the first portion.

7. The manufacturing method of the semiconductor device according to claim 2,
   wherein the joist structure is formed to have a same layer structure as the guard ring.

* * * * *